United States Patent
Yang et al.

(10) Patent No.: US 6,780,532 B2
(45) Date of Patent: Aug. 24, 2004

(54) PHOTODIODE DETECTOR AND FABRICATION METHOD THEREOF

(75) Inventors: Seung-Kee Yang, Suwon-shi (KR); Jea-Myung Baek, Suwon-shi (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 0 days.

(21) Appl. No.: 10/315,586

(22) Filed: Dec. 10, 2002

(65) Prior Publication Data

US 2003/0129781 A1 Jul. 10, 2003

(30) Foreign Application Priority Data

Jan. 8, 2002 (KR) ............................... 10-2002-0000958

(51) Int. Cl.⁷ ................................................. B32B 9/00
(52) U.S. Cl. ....................... 428/699; 257/233; 257/153; 257/91
(58) Field of Search ................................. 257/233, 153, 257/91; 428/699; 117/954

(56) References Cited

U.S. PATENT DOCUMENTS

| | | | |
|---|---|---|---|
| 6,554,912 B2 * | 4/2003 | Sahbari | 134/26 |
| 2003/0047791 A1 * | 3/2003 | Flynn et al. | 257/450 |

OTHER PUBLICATIONS

Tuck, B., "Interaction of p-type dopants during diffusion in InP", Semiconductor Science and Technology, 15 No 3 Mar. 2000 254–258.*
Nelson, A.W., "A study of p-type dopants for InP grown by adduct MOVPE", Journal of Crystal Growth, vol. 68, Issue 1, Sep. 1984, 102–110.*

* cited by examiner

Primary Examiner—Archene Turner
Assistant Examiner—A B Sperty
(74) Attorney, Agent, or Firm—Cha & Reiter, LLC.

(57) ABSTRACT

Disclosed is a photodiode detector including: an InP substrate; a u-$In_{0.53}Ga_{0.47}As$ layer grown and stacked on the InP substrate; an u-Inp layer stacked on an upper portion of the u-$In_{0.53}Ga_{0.47}As$ layer; a SiNx insulation layer stacked on an upper portion of u-Inp layer; an additional insulation layer stacked on an upper portion of the SiNx insulation layer; a P-InP layer formed by Zn diffusing on an u-Inp layer portion below an opening formed on a predetermined position between the additional insulation layer and the SiNx insulation layer; a P-metal layer positioned on an upper portion of the additional insulation layer; and an N-metal layer formed on a lower portion of the InP substrate together with a non-reflection layer. The photodiode detector of the present invention, forms BCB material having a low dielectric constant, which is relatively thick, on the upper portion of the SiNx insulation layer, thereby obtaining the desired capacitance.

4 Claims, 3 Drawing Sheets

PHOTODIODE DETECTOR AND FABRICATION METHOD THEREOF

CLAIM OF PRIORITY

This application claims priority to an application entitled "PHOTODIODE DETECTOR AND FABRICATION METHOD THEREOF," filed in the Korean Industrial Property Office on Jan. 8, 2002 and assigned Serial No. 02-958, the contents of which are hereby incorporated by reference.

BACKGROUND OF THE INVENTION

1. Field of the Invention

The present invention relates to a photodiode detector and, particularly, to a photodiode detector for receiving light and converting the same into an electrical signal in an optical communication system.

2. Description of the Related Art

A photodiode having InGaAs/InP elements in series to form a photoelectron integration circuit is useful in the applications of signals for transmission in a long wavelength region ranging from 1.3 μm to 1.5 μm. The development of the optical communication system is growing fast as optical components (i.e., the photodiode) responsible for a faster data transmission, more bandwidth and noise determining capability have been improved. The bandwidth is defined as a wavelength(Hz) measured in a middle point of the maximum signal transmitted in the optical communication system. Such bandwidth is greatly influenced by capacitance and resistance effects. As all optical elements are made on a small scale, the influence on the bandwidth by the resistance effect is negligible. Therefore, the capacitance effect become a relatively important factor in influencing the transmission speed.

FIG. 1 is a vertical cross-sectional view illustrating a photodiode detector according to an embodiment of a related art. In particular, a photodiode detector with a mesa structure is shown.

As shown in FIG. 1, the conventional photodiode detector includes an InP substrate 3, a u-InGaAs absorption layer 2, a P-InP layer 1 stacked in series, and a SiNx film 4 used for insulation. Note that the P-InP layer 1 and the u-InGaAs absorption layer 2 are etched when forming the detector circuit. Further, a P-metal layer 5 is stacked on the upper portion of the P-InP layer 1, and an N-metal layer 6 together with a SiNx non-reflection layer 7 is deposited on a lower portion of the InP substrate 3.

The foregoing mesa structure grows the P-InP layer 1 using a single crystal growth process without the need for diffusing the operation. Therefore, the process of manufacturing the mesa structure tend to be simple. However, the P-InP layer and the u-InGaAs layer must be etched and thus exposed to the atmosphere during the manufacturing process, and also joins to the SiNx, insulation film. As such, if the InGaAs film having a small energy band gap is utilized, a current leakage is increased, thereby deteriorating the reliability of the photodiode detector.

SUMMARY OF THE INVENTION

The present invention overcomes the above-described problems, and provides additional advantages, by providing a photodiode detector and its related fabrication method without using the etching process for a single crystal of a diode in order to maximally suppress the current leakage.

A further aspect of the present invention is to provide a planar-type photodiode detector and fabrication method thereof, which is capable of receiving high speed signals.

According to another aspect of the invention, a planar type photodiode detector includes: an InP substrate; an u-In.sub.0.53Ga.sub.0.47As layer grown and stacked on the InP substrate; an InP layer stacked on the upper portion of the u-In.sub.0.53Ga.sub.0.47As layer; a SiNx insulation layer stacked on the upper portion of the u-InP layer; an additional insulation layer stacked on the upper portion of the SiNx insulation layer; a P-InP layer formed by Zn diffusing on the u-InP layer portion below an opening formed on a predetermined position between the additional insulation layer and the SiNx insulation layer; a P-metal layer positioned on an upper portion of the additional insulation layer; and, an N-metal layer formed on the lower portion of the InP substrate together with a non-reflection layer.

BRIEF DESCRIPTION OF THE DRAWINGS

The invention will be described in detail with reference to the following drawing in which like reference numerals refer to like elements wherein.

DETAILED DESCRIPTION OF THE PREFERRED EMBODIMENT

In the following description, for purposes of explanation rather than limitation, specific details are set forth such as the particular architecture, interfaces, techniques, etc., in order to provide a thorough understanding of the present invention. However, it will be apparent to those skilled in the art that the present invention may be practiced in other embodiments, which depart from these specific details. For purposes of simplicity and clarity, detailed descriptions of well-known devices, circuits, and methods are omitted so as not to obscure the description of the present invention with unnecessary detail.

Figure 1:
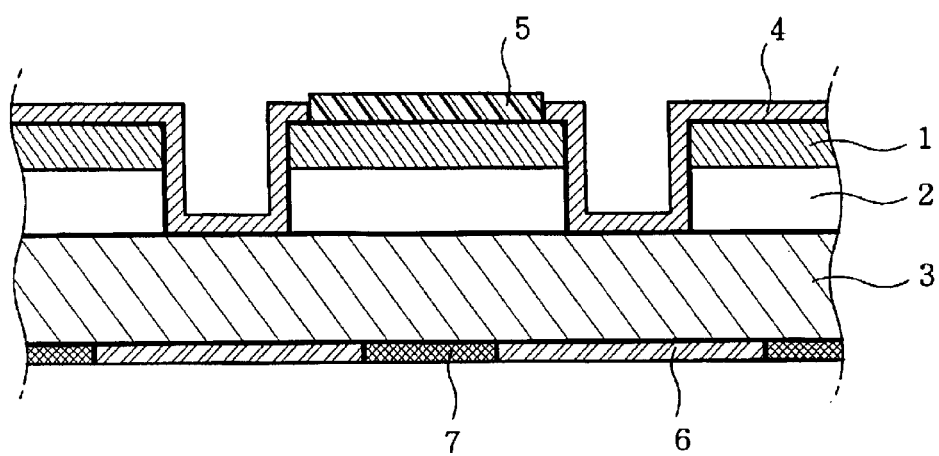
FIG. 1 is a vertical cross-sectional view illustrating the structure of a photodiode detector according to an embodiment of a related art.

A photodiode detector of a mesa structure has a non-uniform surface as shown in FIG. 1., and to fabricate a photodiode detector of a mesa structure, the etching process is required to form an InP substrate 3 and an u-InGaAs absorption layer 2 as shown in the FIG. 1. However, it is difficult to control the etching solution to form the surface as a protruded protion and a collapsed portion as shown in FIG. 1. Also, non-uniformity of the surface reduces the process stability as the protruded portion is damaged easily.

According to the teachings of the present invention as explained hereinafter, the etching process is not required to fabricate a planar type detector, and the surface of the planar type detector is uniformed, so the process stability is improved in the fabrication process of a planar type detector.

Figure 2:
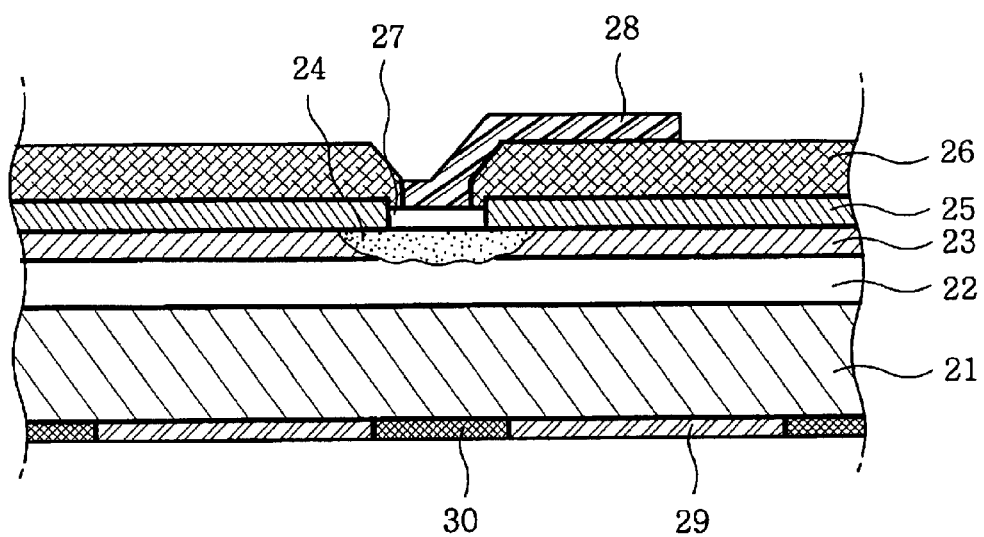
FIG. 2 is a vertical cross-sectional view illustrating the structure of a photodiode detector according to an embodiment of the present invention.

FIG. 2 is a vertical cross-sectional view illustrating the structure of a photodiode detector according to a preferred embodiment of the present invention, in which an u-In.sub.0.53Ga.sub.0.47As layer 22 is grown on an InP substrate 21, then an u-InP layer 23 is grown on the upper portion of the u-In.sub.0.53Ga.sub.0.47As layer 22. Thereafter, a SiNx insulation layer 25 is deposited on the upper portion of the u-InP layer 23 by means of a plasma-enhanced chemical vapor deposition(PECVD), then Zn diffusing is performed on an u-InP layer 23 region with respect to a selective plane by means of photolithography method so that a P-InP layer 24 is formed thereon. A predetermined metal film 27 is formed to secure electric conductivity, and then a predetermined additional insulation layer 26 is deposited on the upper portion of the SiNx insulation layer 25. For the additional insulation layer 26, a material—such as a BCB (Benzocyclobutene) series—capable of maintaining the stability and with a protection against moisture is deployed.

Meanwhile, an opening is formed at a predetermined position between the additional insulation layer 26 and the SiNx insulation layer 25, up to the metal film 27 using the photolithography method, then a pad 28 (P-metal layer) to which wire bonding can be made, is formed by means of the photolithography method. A thinning process is performed on the lower portion of the InP substrate 21 during the processing of a wafer, then a non-reflection coating 30 is applied and finally, an N-metal layer 29 is formed through the photolithography.

The principle teachings of the present invention is to apply a planar type detector for processing a high-speed signal transmission. To achieve this result, a positive electrode capable of delivering a detected signal to a circuit must be formed while making the light reception area(P-InP). A material having a very small dielectric constant than the dielectric constant of the film of the SiNx insulation layer 25, is formed below the pad 28 (P-metal layer), for use as a dielectric film, whereby low capacitance is obtained.

Generally, capacitance is given by the following formula 1:

$$C = \frac{\varepsilon A}{d} \quad \text{[Formula 1]}$$

Here, C represents the capacitance, $\in$ represents the dielectric constant, A and d represent the active area and thickness of an dielectric film, respectively.

According to the above [Formula 1], if the dielectric constant $\in$ is small, and/or the active area A is reduced and/or the thickness grows, then the capacitance C is reduced. Therefore, a material having a small dielectric constant value and whose dielectric film thickness is relatively large, is used on the upper portion of the SiNx film. In the embodiment, a material such as a BCB (Benzocyclobutene) series is used.

The BCB (Benzocyclobutene) 26 is known to have properties, such as low dielectric constant, low loss at high frequency, low moisture absorption, low cure temperature, high degree of planarization, good thermal stability, and excellent chemical resistance. Therefore, for a material deposited on the upper portion of a SiNx insulation layer 25, the present invention utilizes the BCB (Benzocyclobutene) series having relatively a small dielectric constant with a large thickness.

Figure 3:
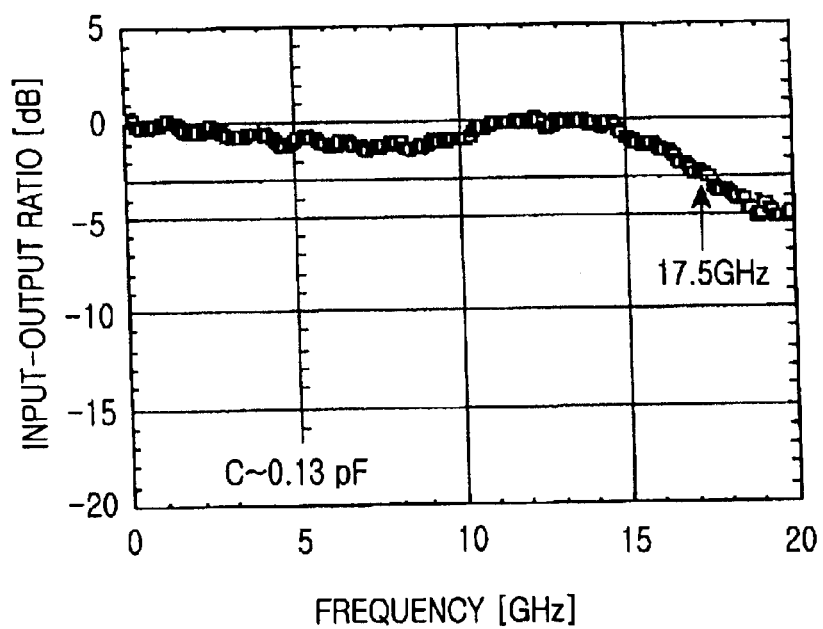
FIG. 3 is a graph illustrating the relation between the input-output ratio(dB) and the frequency(GHz) when an additional insulation layer is formed by a BCB material according to the embodiment of the present invention.

FIG. 3 is a graph illustrating the relation between input-output ratio(dB) and frequency(GHz) when an additional insulation layer is formed with the BCB material according to the present invention, wherein the input-output ratio represents the ratio of input light power to output light power.

In general, the capacitance required by a detector of 10 GHz class is about 0.2 pF. If an additional insulation layer is formed with the use of the BCB material according to the teachings of the present invention, a capacitance of 0.13 pF, smaller than the 0.2 pF, could be obtained and a detector operating at a range of 17.5 GHz or higher could be fabricated. A thick BCB material having a low dielectric constant formed on the upper portion of the SiNx insulation layer enables obtaining the desired capacitance. Therefore, the photodiode detector of the present invention is able to operate at a high speed using planar type detector, which requires no etching process as in the conventional photodiode detector having the mesa structure. And a surface of a planar type detector is completely smooth, so that the process stability is improved in the fabrication process of a planar type detector.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A photodiode detector comprising: an InP substrate; an u-In.sub.0.53Ga.sub.0.47As layer grown and stacked on the InP substrate; an u-InP layer stacked on an upper portion of the u-In.sub.0.53Ga.sub.0.4-7As layer; a SiNx insulation layer stacked on an upper portion of u-InP layer; an insulation layer stacked on an upper portion of the SiNx insulation layer; a P-InP layer formed by Zn diffusing on a u-InP layer portion below an opening formed at a predetermined position between the insulation layer and the SiNx Insulation layer; a P-metal layer positioned on an upper portion of the insulation layer; and, an N-metal layer formed on a lower portion of the InP substrate together with a non-reflection layer.

2. The photodiode detector according to claim 1, wherein the insulation layer deposited on an upper portion of the SiNx insulation layer is formed by a BCBBenzocyclobutene (BCB) material having a relatively low dielectric constant.

3. A method for fabricating a photodiode detector, comprising the steps of: growing an u-In.sub.0.53Ga.sub.0.47As layer on an InP substrate; growing an u-InP layer on an upper portion of the u-In.sub.0.53Ga.sub.0.47As layer; depositing a SiNx insulation layer on an upper portion of the u-InP layer; forming a predetermined insulation layer on an upper portion of the SiNx insulation layer; forming an opening at a predetermined position between the insulation layer and the SiNx insulation layer; forming a P-InP layer by diffusing Zn on a u-InP layer portion below the opening; and, forming an N-metal layer on a lower portion of the InP substrate together with a non-reflection layer.

4. The method according to claim 3, wherein the insulation layer deposited on the upper portion of the SiNx insulation layer is formed by a Benzocyclobutene (BCB) material having a relatively low dielectric constant.

* * * * *